United States Patent [19]

Schoen et al.

[11] Patent Number: 4,486,094
[45] Date of Patent: Dec. 4, 1984

[54] ORIGINAL HOLDER FOR A PRINTING PLATE PROCESSING APPARATUS

[75] Inventors: Klaus-Peter Schoen; Klaus Schmitt, both of Wiesbaden, Fed. Rep. of Germany

[73] Assignee: Hoechst Aktiengesellschaft, Frankfurt am Main, Fed. Rep. of Germany

[21] Appl. No.: 420,332

[22] Filed: Sep. 20, 1982

[30] Foreign Application Priority Data

Sep. 23, 1981 [DE] Fed. Rep. of Germany ....... 3137786

[51] Int. Cl.³ .............................................. G03B 27/64
[52] U.S. Cl. ....................................................... 355/76
[58] Field of Search ................................... 355/73, 76

[56] References Cited

U.S. PATENT DOCUMENTS

| | | | |
|---|---|---|---|
| 3,464,768 | 9/1969 | Florsheim et al. | 355/76 |
| 3,682,545 | 8/1972 | Grimm | 355/76 |
| 3,740,138 | 6/1973 | Blatherwick | 355/73 |
| 3,762,815 | 10/1973 | Friedel | 355/76 |
| 4,006,984 | 2/1977 | Friese | 355/11 |

FOREIGN PATENT DOCUMENTS

| | | |
|---|---|---|
| 26016 | 4/1981 | European Pat. Off. |
| 760847 | 10/1954 | Fed. Rep. of Germany |
| 1164819 | 3/1964 | Fed. Rep. of Germany |
| 885963 | 9/1943 | France ....... 355/76 |
| 428087 | 5/1935 | United Kingdom |

*Primary Examiner*—Monroe H. Hayes
*Attorney, Agent, or Firm*—Schwartz, Jeffery, Schwaab, Mack, Blumenthal & Koch

[57] ABSTRACT

An original holder for a printing plate processing apparatus for rapid exchange of an original in a vacuum frame covered by a glass plate and exposed in the exposure device of a printing plate processing apparatus. The glass plate is held in its open position by a gas pressure element to facilitate insertion of the original. Two U-shaped metal sheets serve as supports for two vacuum frames which are each evacuated following insertion of an original and closing of the glass cover plate. Swivel joints are attached at the sides of the supports which enable the original holder to be pivoted through an angle of 360° and which are additionally horizontally slidable in the guides of supporting and guiding arms. The vacuum frames are individually pivotably mounted in their supports by ball guides in guide tracks. When one of the vacuum frames is in the vertical exposure position in the exposure opening in the wall of the exposure device housing and its support is secured to the housing wall by locking devices, the second vacuum frame is pivoted into the horizontal position by means of a lever so that an original can be inserted therein. The second vacuum frame is thereafter folded back again to the vertical position in its support. After exposure of the original in the first vacuum frame, the entire original holder is drawn into the change position, pivoted through 180°, and the original in the second vacuum frame is moved into the exposure opening. In an alternate embodiment, the swivel joints are fixedly mounted adjacent the edges of the exposure opening, and the original holder pivots inside the exposure device.

15 Claims, 6 Drawing Figures

PRIOR ART

ORIGINAL HOLDER FOR A PRINTING PLATE PROCESSING APPARATUS

BACKGROUND OF THE INVENTION

The present invention relates to an original holder for a printing plate processing apparatus, comprising a vacuum frame having a glass cover plate with a seal, a gas pressure element supporting the glass cover plate of the original holder against a support of the vacuum frame, and a vacuum line leading to a vacuum pump.

U.S. Pat. No. 4,006,984 discloses an original holder of this type, representing an integral part of a printing plate processing apparatus. Known printing plate processing apparatus comprise a charging station for charging the printing plates prior to exposure, an exposure device for exposing the original to light, an optical imaging device for projecting the image of an original onto the electrostatically charged printing plate, and transporting, developing and drying devices.

By means of the exposure device and of the imaging device, exposure of the whole original page is effected, and an image of the original is projected onto the electrostatically charged printing plate. The original and the printing plate must be positioned in the object or image plane, in order to obtain the predetermined reproduction scale. This is achieved by manually placing the original on a horizontally arranged vacuum frame of an original holder and covering it with a glass plate. Then the vacuum frame is pivoted through an angle of 90° into the vertical exposure position. After the exposure, the original holder is swung back to its horizontal position; the glass plate is opened, and the original is removed and replaced by a new original. After closing of the glass plate, the original holder is again pivoted into the vertical exposure position. During these steps, the printing plate processing apparatus does not work, i.e., its utilization capacity is low.

SUMMARY OF THE INVENTION

Accordingly, it is the object of the present invention to provide an improved original holder for a printing plate processing apparatus.

Another object of the present invention is to provide an original holder for a printing plate processing apparatus in which one original can be inserted in position for exposure at the same time a plate is being exposed to the image of another original.

A further object of the present invention is to provide an original holder for a printing plate processing apparatus which has an increased processing capacity and higher utilization capacity than prior devices.

These and other objects of the invention are achieved by providing an original holder for a printing plate processing apparatus, said original holder comprising first and second vacuum frames each having a transparent cover plate, means for supporting said first and second vacuum frames, said first and second vacuum frames each being individually pivotably mounted in said supporting means, means on said support means for pivoting the original holder through an angle of 360°, and means for connecting said first and second vacuum frames to a vacuum source.

By this invention, the processing capacity of a printing plate processing apparatus is almost doubled, since during the exposure of the original on the first vacuum frame the second vacuum frame is pivoted through an angle of 90° with respect to the first vacuum frame, provided with a new original and folded back toward the first vacuum frame, so that after the exposure process the second vacuum frame with the new original therein needs only to be pivoted into the exposure position and placed before the exposure opening of the exposure device.

BRIEF DESCRIPTION OF THE DRAWINGS

The invention will be described in further detail with reference to the attached drawings wherein:

FIG. 3a is a sectional side view of a detail of FIG. 3;

DETAILED DESCRIPTION OF PREFERRED EMBODIMENTS

Figure 1:
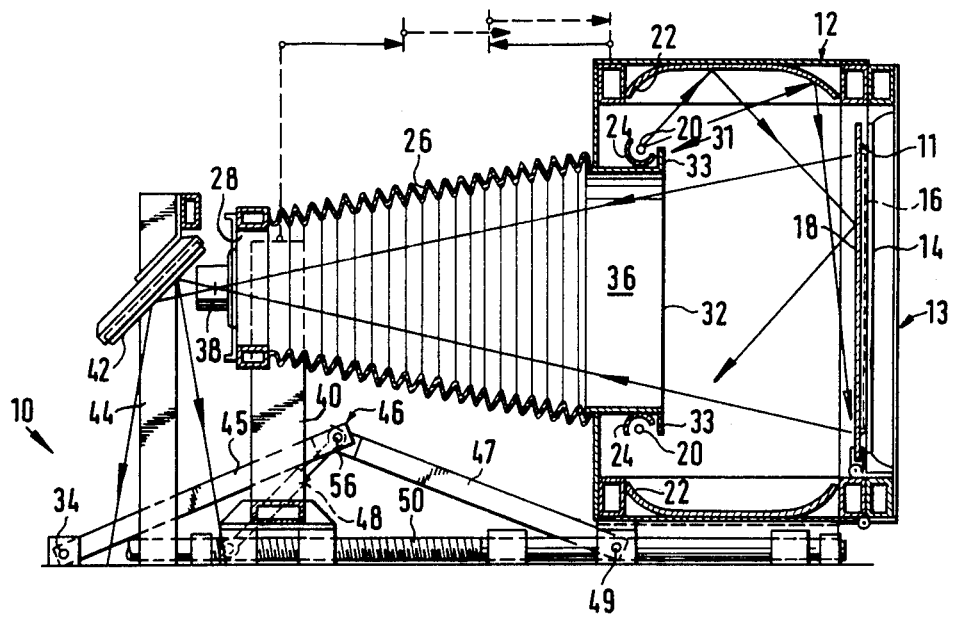
FIG. 1 is a sectional partial view of a known printing plate processing apparatus.

FIG. 1 shows a section of a known printing plate processing apparatus, designated as 10 and comprising an exposure device 12 and an imaging device comprising an optical system 38 with a diaphragm and a shutter 28 and a mirror 42. They are displaceable by means of an elbow lever drive 46 which comprises two levers 45, 47. The first lever 45 is supported by a stationary bearing 34, whereas the second lever 47 is pivoted in a slide bearing 49 at the back of the exposure device 12. Together with the spindle 50, the two levers 45, 47 of the elbow lever drive 46 form a collapsible triangle. The two levers 45, 47 are engaged by a further lever 48 at their pivotal point 56. Spindle 50 is driven by a motor (not shown). If the bracket 40 is moved by the rotation of the spindle 50 to the right-hand side, toward the exposure device 12, the exposure device simultaneously moves toward the bracket 40. As soon as the lever 48 has passed its vertical position, the direction of movement of the exposure device 12 is reversed and it moves in the same direction as the bracket, i.e., toward the right-hand side. A reduction or enlargement of the image of the original 16 projected onto the printing plate is produced by appropriate displacement of the bracket 40.

Figure 2:
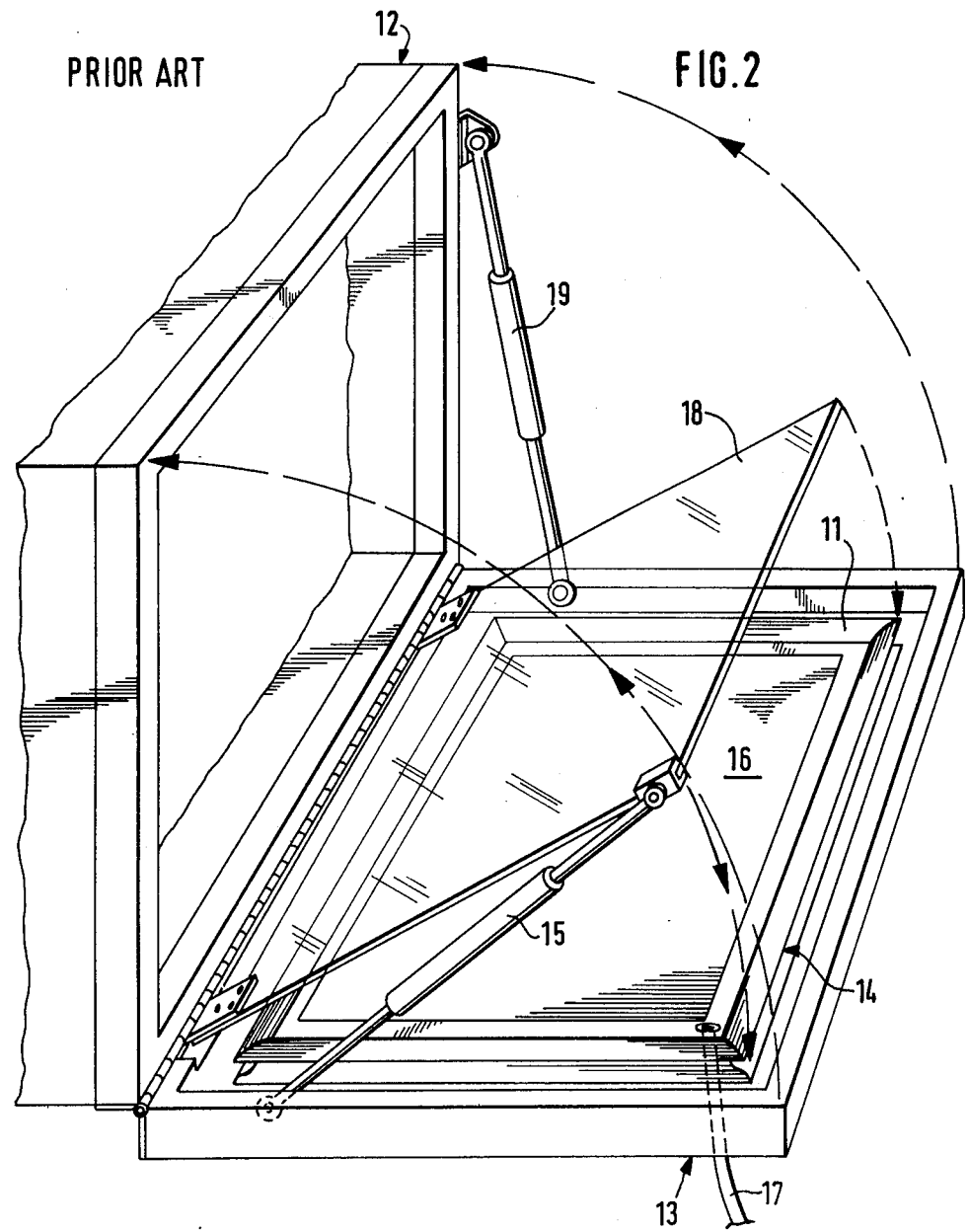
FIG. 2 is a perspective view of the original holder of the known printing plate processing apparatus shown in FIG. 1.

A holder 14 which receives the original to be copied is arranged in a hinged door 13 on the exposure device 12. As can be seen in FIG. 2, the original holder 14 is connected to a vacuum pump (not shown) via a vacuum line 17. In order to ensure that the original 16 is smoothly pressed onto the surface of the original holder 14, a glass plate 18 is provided which rests on a sealing ring 11 surrounding the surface of the holder 14. The opened glass plate 18 is propped against the hinged door 13 by a gas pressure element 15, e.g., a gas pressure damper. It is thereby ensured that the opened glass plate 18 remains in any set position so that the original 16 can be inserted in the holder 14 without difficulty. Door 13 is linked to the housing of the exposure device by another gas pressure element or damper 19. This gas pressure element 19 supports the opening and closing movement of the hinged door 13, which is effected manually.

In the interior of the exposure device 12, close to its back wall, radiation sources for the exposure of the original 16 are arranged. The radiation sources 20 are surrounded by reflectors 24, which direct the incident radiation toward further reflectors 22, which then reflect the incident radiation at a predetermined angle onto the original 16 fixed in the holder 14. The radiation sources 20 are shielded against the original 16 by a screen 32 which consists of an attachment 31 which, at the back wall of the exposure device 12, surrounds the entrance opening 36 of the bellows 26 of a camera. The attachment 31 is provided with a rim 33. At the end opposite the entrance opening 36 bellows 26 is closed by the optical system 38 which is actuated via the shutter 28. The bellows 26 with the diaphragm and the optical system is connected to the first bracket 40. A mirror 42 deflects the light beams which have been reflected by the exposed original 16 and which strike the mirror after passing through the bellows 26, the diaphragm and the optical system 38. Mirror 42 is fastened to the upper part of a second, stationary bracket 44, at the level of the optical system 38. The mirror 42 is inclined with respect to the horizontal at an angle of, for example, 45°.

To insert the original 16 into the original holder 14, the hinged door 13 of the exposure device 12 is opened, the glass plate 18 is lifted and, due to the gas pressure element 15, remains in its set position, and the original 16 is placed onto the original holder 14. The hinged door 13 is then closed again, and the exposure process of the original 16 starts. It is not until this exposure process is finished that the hinged door can be opened, and the original can be removed and replaced by another original, which is thereafter brought to the vertical exposure position by again closing the hinged door.

Figure 3:
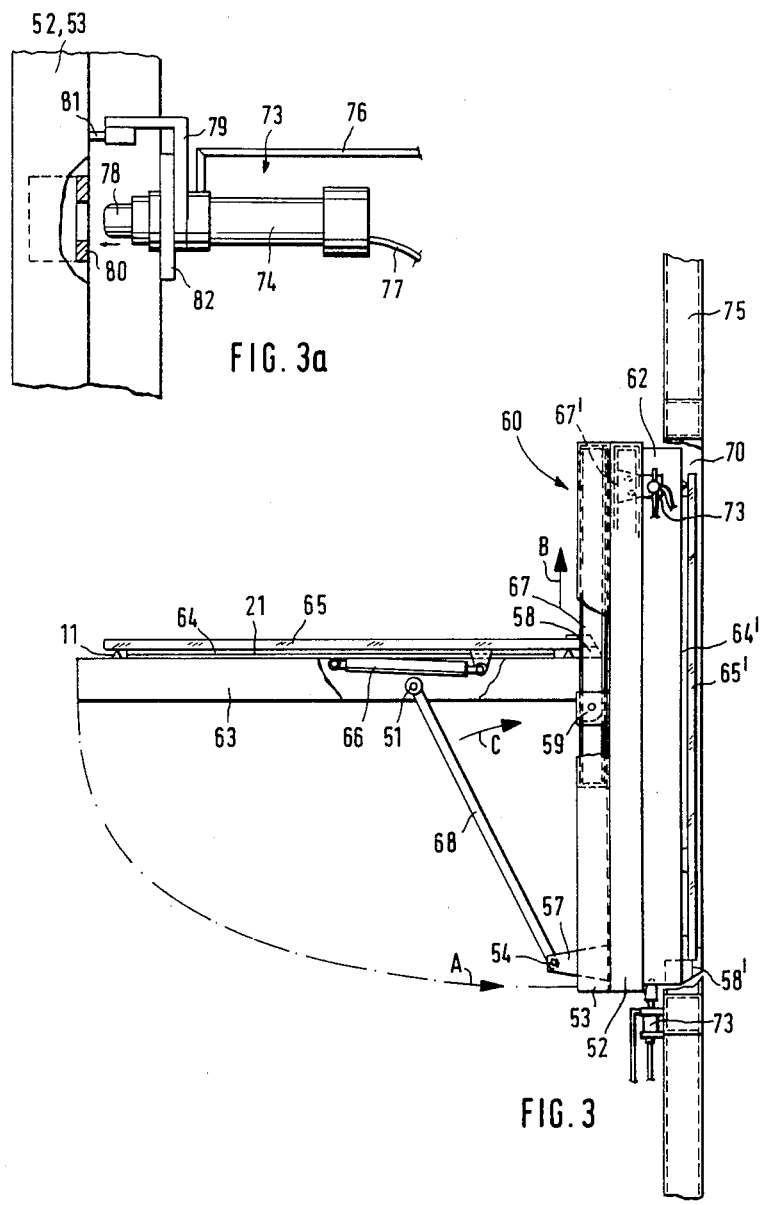
FIG. 3 is a schematic view of an original holder according to the present invention.

FIG. 3 shows an original holder 60 according to the present invention which comprises two vacuum frames 62, 63 which can be horizontally shifted and pivoted. One of the vacuum frames 62 is shown in the vertical exposure position, whereas the second vacuum frame 63 is shown pivoted through 90°, as compared with the first frame 62, i.e., the second frame is in a horizontal position. In the illustrative embodiment of the invention shown in FIG. 4, the original holder 60 is fastened to the outside of a wall of the housing 75 of exposure device 12, by means of horizontal supporting and guiding arms 61 and 61'. The exposure device 12 may be a known type of device, e.g., a device as shown in FIG. 1, and, therefore, it is not described in further detail. In the vertical exposure position, an exposure opening 70 of exposure device 12 is closed by the vacuum frame 62. Vacuum frames 62 and 63 are displaceably arranged in supports 52, 53. As can be seen more clearly from FIGS. 4 and 5, swivel joints 55 and 55' are provided on each side of the supports 52 and 53 thereby making it possible to pivot the original holder 60 through an angle of 360°.

Supports 52, 53 are in the form of U-shaped metal sheets; these are provided with guide rails 67 and 67' which may, for example, be ball guides. Each vacuum frame can be displaced along the two linear guide rails of its support. The guide rails 69 and 69' of the horizontal supporting and guiding arms 61 and 61' receive the swivel joints 55 and 55' of the supports 52 and 53. In the so-called folded position of the original holder 60, the back sides of the supports are directed towards each other and the transparent glass plates 65, 65' of the two vacuum frames 62, 63 face outwardly. In this folded position, the original holder 60 can be shifted along the guide rails 69 and 69' in the support and guide arms 61 and 61' and thus be moved into or away from the vertical exposure position.

As can be seen from FIG. 3, one end of a lever 68 is fastened to the vacuum frame 63 at the pivotal point 51. The other end of lever 68 is fastened to a support bearing 57, at the pivotal point 54. Support bearing 57 is mounted on the support 53. The lever 68 can be pivoted about the two pivotal points 51, 54 and, together with the ball guide 67 in support 52, or ball guide 67' in support 53, forms a lever drive. If the vacuum frame 63 which is shown in the horizontal position in FIG. 3 is pivoted downwardly in the direction indicated by arrow A, the lever 68 moves toward the support 53 in the direction indicated by arrow C, its path of motion being a circular arc, while a sliding bearing 59 of the vacuum frame 63, located in the ball guide 67 of the frame 53, is displaced upwardly, in the direction indicated by arrow B. In this way, the vacuum frame 63 is pivoted into the vertical position adjacent its support 53.

Analogously, a similar lever 68 connects the vacuum frame 62 to its support 52. For clarity of illustration, this arrangement has been omitted from the drawing.

During exposure, the support 52 of the vacuum frame 62 which closes the exposure opening 70 of the exposure device 12, and the housing wall 75 are firmly secured to each other by three locking mechanisms 73, so that no displacement of the vacuum frame can take place during the exposure.

As shown in FIG. 3a, a suitable locking mechanism 73 comprises a pneumatic cylinder 74 which is connected via lines 76, 77 with a pressure source (not shown). The pneumatic cylinder 74 is fastened to the housing of the printing plate processing apparatus by means of a plate 82. The piston of the cylinder is provided with a locking pin 78 which engages a hole in a lug 80 fastened to support 52 or, respectively, 53 and thus firmly connects the support and the housing when the support is in the vertical position. A bracket 79 carries a microswitch 81 which is actuated when the support is pivoted to the vertical position and initiates the admission of pressure to the pneumatic cylinder 74 and thus the locking process. For example, three locking mechanisms 73 may be provided, i.e., one installed on each of the two vertical edges of the housing wall (shown in FIG. 3 in the upper position) and one installed at the center of the lower horizontal edge of the exposure opening 70, so that a three-point locking is effected.

Vacuum frames 62 and 63 are of identical design. Each of them receives an original 64 or 64' on a frosted glass plate 21 which is covered by the transparent glass plate 65 or, respectively, 65' resting on a seal or gasket 11. A gas pressure element such as gas pressure damper 66, which is similar to the gas pressure element 15 shown in FIG. 2, links the glass plate 65, or respectively 65', with the vacuum frame 63 or, respectively 62, and maintains the glass plate which can be swivelled about a hinge 58 or, respectively, 58', in its set position.

Figure 4:
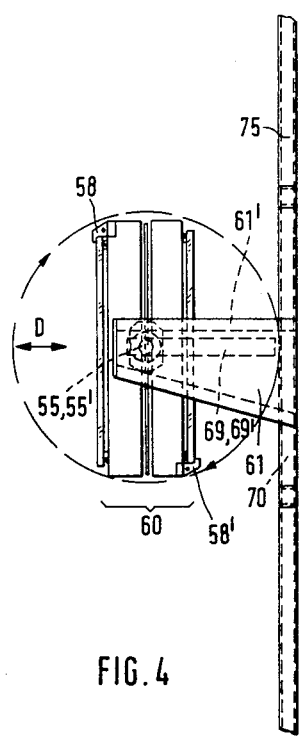
FIG. 4 is a schematic view of the original holder, in which the two vacuum frames are in a folded, vertical position, away from the exposure opening of the exposure device.

In the embodiment of the invention shown in FIGS. 3 and 4, the original holder 60 is displaceably received in the lateral, horizontally extending supporting and guiding arms 61 and 61' which are attached to the housing wall 75 of exposure device 12. Pivoting of the original holder 60, which is shown in the folded position in FIG. 4, about the swivel joints 55 and 55' is carried out outside the exposure device 12. Swivel joints 55 and 55' are equipped with stops which engage the original holder during pivoting and thus define places where the original holder can be stably positioned.

Figure 5:
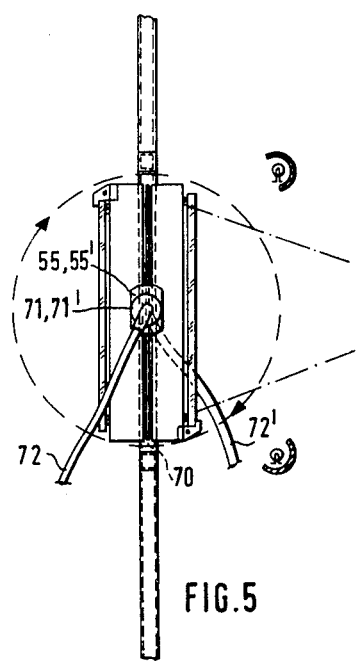
FIG. 5 is a schematic sectional view similar to FIG. 4 of another embodiment of the invention in which the two vacuum frames pivot within the exposure opening of the exposure device.

FIG. 5 shows a schematic view of an original holder 60 in which stationary swivel joints 55, 55' are fixed at the periphery of the exposure opening 70 of exposure device 12. This makes it possible to pivot the original holder 60 within the exposure device, i.e., the original holder moves along a path through the interior of the exposure device 12 when it is pivoted about the swivel joints 55, 55' of the holder, through an angle of, for example, 180°. Vacuum lines 72 and 72', which lead to the vacuum frames 62 or 63 for evacuation of the original holder 60, pass through pins 71 and 71' in the swivel joints 55 and 55', respectively.

For the sake of clarity, the lateral support and guide arms 61 and 61' have been omitted from FIG. 3.

As seen in FIG. 4, it is possible to shift the position of holder 60 in the directions indicated by double arrow D. Starting from the position of the original holder 60 shown in FIG. 4, an original 64 is inserted into the vacuum frame 63 as follows: The vacuum frame 63 is pivoted to the horizontal position illustrated in FIG. 3, and the glass plate 65 is swung upwardly about hinge 58. Gas pressure element 66, similar to a gas pressure spring, opposes the falling-back of the glass plate to its original position and keeps it open so that the original 64 can be inserted without difficulty. Then the glass plate is closed, the vacuum frame 63 is evacuated and pivoted to the vertical exposure position adjacent the support 53, and the whole original holder 60 is pivoted through an angle of 180°, so that the original 64 faces toward the exposure opening 70. In the next step, the original holder 60 is moved toward the exposure device 12, and the exposure opening 70 is closed by the vacuum frame 63 which is firmly connected to the housing wall 75 by the locking mechanisms 73. The current supply for the exposure of the original 64 is switched on at the same time the locking mechanisms 73 are actuated.

While vacuum frame 63 is in the vertical exposure position, the second vacuum frame 62 is pivoted along guide rail 67' through an angle of 90° to the horizontal position, an original 64' is inserted, and the vacuum frame 62 is folded upwards again to its support 52. After the exposure of the original 64, the complete original holder 60 is withdrawn from the exposure aperture 70, pivoted through an angle of 180° and again placed before the exposure aperture 70, so that the latter is now closed by the vacuum frame 62 with the original 64'.

Since a second original is inserted during the exposure of a first original, the exchange of originals does not influence the operating cycles of the exposure device. This also means that the exchange of originals does not affect the timing of the operating cycles of the printing plate processing apparatus. As a result of these facts, the processing capacity of the apparatus of the invention is considerably increased compared to prior devices.

The foregoing description has been set forth merely to illustrate the invention and is not intended to be limiting. Since modifications of the described embodiments incorporating the spirit and substance of the invention may occur to persons skilled in the art, the scope of the invention is to be limited solely with respect to the appended claims and equivalents.

We claim:

1. An original holder for a printing plate processing apparatus, said original holder comprising first and second vacuum frames each having a transparent cover plate, a seal provided between each transparent cover plate and the associated vacuum frame, support means for said first and second vacuum frames, said support means comprising U-shaped metal sheets, the backs of which are directed toward each other, and the transparent cover plates of the two vacuum frames facing outward in opposite directions when both vacuum frames are in a folded position adjacent the associated support means, said first and second vacuum frames each being individually pivotably mounted in said support means, means on said support means for pivoting the original holder through an angle of 360°, and means for connecting said first and second vacuum frames to a vacuum source.

2. An original holder according to claim 1, further comprising locking mechanisms for securing said support means in a vertical position to a housing wall of an exposure device during exposure of an original in one of said vacuum frames.

3. An original holder according to claim 1, wherein, when said support means is in a vertical position, one of the vacuum frames is pivotable from a vertical position adjacent the support means to a horizontal position with the associated transparent cover plate on top to facilitate insertion of an original.

4. An original holder according to claim 1 further comprising means for holding the transparent cover plate of each vacuum frame in an open position.

5. An original holder according to claim 4, wherein said holding means comprise gas pressure elements.

6. An original holder according to claim 1, wherein said pivoting means comprise a pair of swivel joints mounted on the sides of said support means.

7. An original holder according to claim 6, wherein said vacuum source connecting means comprise individual vacuum lines leading from each vacuum frame to a vacuum pump.

8. An original holder according to claim 7, wherein said vacuum lines pass through pins in said swivel joints which are fixed at the periphery of an exposure device of the printing plate processing apparatus.

9. An original holder according to claim 6, wherein said swivel joints are provided with stops for engaging the original holder during pivoting in one of a plurality of desired positions along guide rails within said support means.

10. An original holder according to claim 6, wherein laterally-extending horizontal supporting and guiding arms are provided having horizontal guide tracks for slidably receiving said swivel joints, whereby the original holder can be slid back and forth into and out of the vertical exposure position.

11. An original holder according to claim 6, wherein said swivel joints are mounted adjacent the edge of the exposure opening in the wall of the exposure device housing, and the original holder moves along a path through the interior of the exposure device when the original holder is pivoted through an angle of 180°.

12. An original holder according to claim 1, wherein a linear guide means for each vacuum frame is provided in the associated support means.

13. An original holder according to claim 12, wherein said guide means comprise ball guide tracks.

14. An original holder according to claim 12, wherein one end of a lever is pivotably mounted on each vacuum frame and the other end of each lever is pivotably mounted on the associated support means via a support bearing.

15. An original holder according to claim 14, wherein said lever can be pivoted about its pivotable mounting points, and, together with the guide means, forms a lever drive in the support means.

* * * * *